United States Patent
Yoon et al.

(10) Patent No.: US 9,504,147 B2
(45) Date of Patent: *Nov. 22, 2016

(54) RESIN COMPOSITION, AND PRINTED CIRCUIT BOARD USING SAME

(71) Applicant: LG INNOTEK CO., LTD., Seoul (KR)

(72) Inventors: Yeo Eun Yoon, Seoul (KR); Myeong Jeong Kim, Seoul (KR); Sungjin Yun, Seoul (KR); Sanga Ju, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/651,771

(22) PCT Filed: Dec. 6, 2013

(86) PCT No.: PCT/KR2013/011312
§ 371 (c)(1),
(2) Date: Jun. 12, 2015

(87) PCT Pub. No.: WO2014/092401
PCT Pub. Date: Jun. 19, 2014

(65) Prior Publication Data
US 2015/0319855 A1 Nov. 5, 2015

(30) Foreign Application Priority Data
Dec. 12, 2012 (KR) .................. 10-2012-0144787

(51) Int. Cl.
| | |
|---|---|
| H05K 1/05 | (2006.01) |
| B32B 15/092 | (2006.01) |
| B32B 27/20 | (2006.01) |
| B32B 27/26 | (2006.01) |
| B32B 27/38 | (2006.01) |
| C08G 59/24 | (2006.01) |
| C08G 59/50 | (2006.01) |
| C08L 63/00 | (2006.01) |
| C08K 3/22 | (2006.01) |
| H05K 1/03 | (2006.01) |
| C08G 59/22 | (2006.01) |

(52) U.S. Cl.
CPC ............ *H05K 1/0373* (2013.01); *C08G 59/22* (2013.01); *C08K 3/22* (2013.01); *C08L 63/00* (2013.01); *H05K 1/053* (2013.01); *C08K 2003/2227* (2013.01); *H05K 2201/0209* (2013.01)

(58) Field of Classification Search
None
See application file for complete search history.

(56) References Cited

U.S. PATENT DOCUMENTS

| 4,594,291 A | 6/1986 | Bertram et al. |
|---|---|---|
| 4,847,348 A | 7/1989 | Fischer et al. |
| 2007/0232727 A1 * | 10/2007 | Lin ........................ B82Y 30/00 523/440 |
| 2009/0105388 A1 | 4/2009 | Tanaka et al. |
| 2010/0016473 A1 | 1/2010 | Kaji et al. |
| 2010/0016498 A1 * | 1/2010 | Kaji ...................... C08G 59/245 524/540 |
| 2011/0163461 A1 * | 7/2011 | Nowak ................ C08G 59/226 257/793 |
| 2012/0202918 A1 | 8/2012 | Singh et al. |
| 2012/0296010 A1 * | 11/2012 | Shimizu ................. C08L 63/00 523/400 |
| 2014/0015000 A1 | 1/2014 | Nishiyama et al. |
| 2015/0305152 A1 * | 10/2015 | Kil .......................... C08L 63/00 174/258 |
| 2015/0319854 A1 * | 11/2015 | Kim ........................ C08K 3/22 174/258 |
| 2015/0319855 A1 | 11/2015 | Yoon et al. |
| 2015/0319856 A1 * | 11/2015 | Yun .......................... C08K 3/38 174/258 |
| 2015/0319857 A1 * | 11/2015 | Yoon ....................... C08K 3/28 174/258 |
| 2015/0334827 A1 * | 11/2015 | Kim ........................ C08G 59/22 174/258 |

FOREIGN PATENT DOCUMENTS

| CN | 101198632 A | 6/2008 | |
|---|---|---|---|
| CN | 101466757 | 6/2009 | |
| CN | 101611069 A | 12/2009 | |
| CN | 101974208 | 2/2011 | |
| CN | 102559113 | 7/2012 | |
| CN | 102786773 A | 11/2012 | |
| JP | 06-200121 A | 7/1994 | |
| JP | 06-216484 A * | 8/1994 | ............... H05K 1/05 |
| JP | 06-334288 A * | 12/1994 | ............... H05K 1/05 |

(Continued)

OTHER PUBLICATIONS

Machine translation of JP 06-334288 A (no date).*
Machine translation of JP 06-216484 A (no date).*
International Search Report dated Jan. 24, 2014 issued in Application No. PCT/KR2013/011312.
International Search Report dated Jan. 24, 2014 issued in Application No. PCT/KR2013/011313 (with English translation).
International Search Report dated Jan. 24, 2014 issued in Application No. PCT/KR2013/011314 (with English translation).
International Search Report dated Jan. 24, 2014 issued in Application No. PCT/KR2013/011315 (with English translation).
International Search Report dated Jan. 27, 2014 issued in Application No. PCT/KR2013/010688 (with English translation).
International Search Report dated Jan. 27, 2014 issued in Application No. PCT/KR2013/011311 (with English translation).

(Continued)

*Primary Examiner* — Michael J Feely
(74) *Attorney, Agent, or Firm* — KED & Associates, LLP

(57) ABSTRACT

According to one embodiment of the present invention, an epoxy resin composition comprises: a resin including an epoxy compound, triethylenediamine, diphenylphosphine and/or tetraphenylborate; a curing agent including diaminodiphenylsulfone, ethylenediamine, diaminopropane, methanediamine, phenylenediamine and/or triethanolamine; and an inorganic filler, wherein the inorganic filler includes at least two alumina ($Al_2O_3$) groups classified by particle size.

13 Claims, 1 Drawing Sheet

(56) References Cited

FOREIGN PATENT DOCUMENTS

| | | | |
|---|---|---|---|
| JP | 2001-279064 A | 10/2001 | |
| JP | 2008-277407 A | 11/2008 | |
| JP | 2011-181648 A | 9/2011 | |
| JP | 2011-181650 A | 9/2011 | |
| JP | 2011-181651 A | 9/2011 | |
| JP | 2011-181652 A | 9/2011 | |
| JP | 2012092297 | 5/2012 | |
| KR | 10-2000-0025443 A | 5/2000 | |
| KR | 10-2004-0039090 A | 5/2004 | |
| KR | 10-2007-0009604 A | 1/2007 | |
| KR | 10-2010-0008771 A | 1/2010 | |
| KR | 10-0937918 B1 | 1/2010 | |
| KR | 10-0970906 B1 | 7/2010 | |
| KR | 10-2010-0134313 A | 12/2010 | |
| KR | 10-2011-0017853 A | 2/2011 | |
| KR | 10-2011-0027807 A | 3/2011 | |
| KR | 10-2012-0074109 A | 7/2012 | |
| KR | 10-2012-0109266 A | 10/2012 | |
| WO | WO 2009/138301 A1 | 11/2009 | |
| WO | WO 2009/144955 A1 | 12/2009 | |
| WO | WO 2012/133587 | 10/2012 | |
| WO | WO 2013/009114 A2 * | 1/2013 | ............. C08L 63/00 |
| WO | WO 2013/032238 A2 * | 3/2013 | ............. C08G 59/20 |

OTHER PUBLICATIONS

U.S. Office action dated Feb. 3, 2016 issued in co-pending U.S. Appl. No. 14/647,721.
U.S. Office action dated Jan. 14, 2016 issued in co-pending U.S. Appl. No. 14/651,768.
U.S. Office action dated Jan. 14, 2016 issued in co-pending U.S. Appl. No. 14/651,842.
U.S. Office action dated Feb. 11, 2016 issued in co-pending U.S. Appl. No. 14/651,783.
U.S. Office action dated Jan. 14, 2016 issued in co-pending U.S. Appl. No. 14/652,031.
Chinese Office Action dated May 24, 2016 issued in Application No. 201380062540.6 (with English Translation).
U.S. Notice of Allowance dated Jun. 6, 2016 issued in U.S. Appl. No. 14/647,721.
U.S. Notice of Allowance dated May 9, 2016 issued in U.S. Appl. No. 14/651,768.
U.S. Notice of Allowance dated May 10, 2016 issued in U.S. Appl. No. 14/651,842.
U.S. Notice of Allowance dated May 11, 2016 issued in U.S. Appl. No. 14/652,031.
Chinese Office Action dated Jun. 1, 2016 issued in Application No. 201380065257.9 (with English Translation).
Chinese Office Action dated Jun. 1, 2016 issued in Application No. 201380065310.5 (with English Translation).
Chinese Office Action dated Jun. 1, 2016 issued in Application No. 201380065125.6 (with English Translation).
Chinese Office Action dated Jun. 1, 2016 issued in Application No. 201380070409.4 (with English Translation).
U.S. Notice of Allowance dated Jun. 16, 2016 issued in U.S. Appl. No. 14/651,783.

* cited by examiner

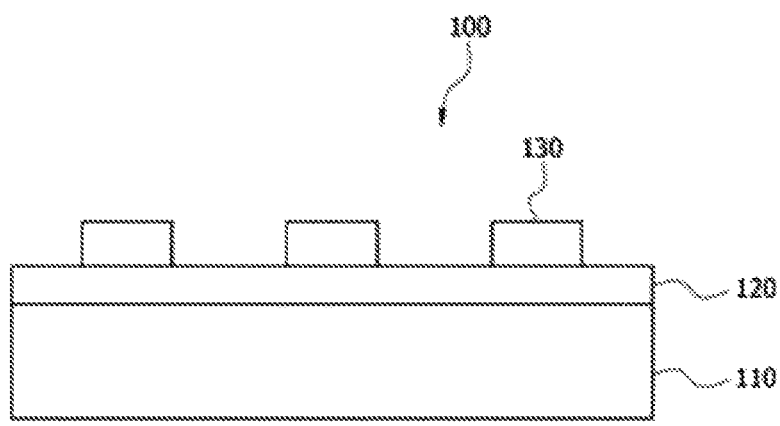

RESIN COMPOSITION, AND PRINTED CIRCUIT BOARD USING SAME

CROSS-REFERENCE TO RELATED PATENT APPLICATIONS

This application is a U.S. National Stage Application under 35 U.S.C. §371 of PCT Application No. PCT/KR2013/011312, filed Dec. 6, 2013, which claims priority to Korean Patent Application No. 10-2012-0144787, filed Dec. 12, 2012, whose entire disclosures are incorporated herein by reference.

TECHNICAL FIELD

The present invention relates to a resin composition, and more particularly, to a resin composition and a printed circuit board using the same.

BACKGROUND ART

Various electronic parts used in electronic devices may, for example, be heating elements. Heat emitted by the heating elements may degrade the performance and reliability of the electronic devices. With the realization of high integration and higher capacity of electronic parts, there is an increasing concern about heat dissipation problems of printed circuit boards on which the electronic parts are mounted, or materials to which the electronic parts attached.

To improve the heat dissipation performance, a heat dissipation board including a non-conductive heat dissipation layer is proposed. For example, the non-conductive heat dissipation layer includes a ZnO-based ceramic material as a main ingredient. In this case, the non-conductive heat dissipation layer may be made of a composition including $Bi_2O_3$, a praseodymium oxide (PrxOy), other additives, etc. (Korean Unexamined Patent Application Publication No. 2011-0027807).

However, such a non-conductive heat dissipation layer has a problem in that it is difficult to handle heat emitted by elements due to its insufficient thermal conductivity.

DISCLOSURE

Technical Problem

To solve the above problems, one aspect of the present invention provides a resin composition, and a printed circuit board using the same.

Technical Solution

According to an aspect of the present invention, there is provided a resin composition which includes a resin including at least one selected from the group consisting of an epoxy compound represented by the following Formula 1, triethylenediamine, diphenylphosphine, and tetraphenylborate, a curing agent including at least one selected from the group consisting of diaminodiphenylsulfone, ethylenediamine, diaminopropane, methanediamine, phenylenediamine, and triethanolamine, and an inorganic filler, wherein the inorganic filler includes at least two alumina ($Al_2O_3$) groups classified according to a particle size.

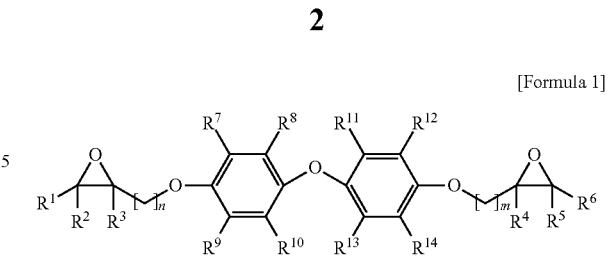

[Formula 1]

In Formula 1, $R^1$ to $R^{14}$ may each independently be selected from the group consisting of H, Cl, Br, F, a $C_1$-$C_3$ alkyl, a $C_2$-$C_3$ alkene, and a $C_2$-$C_3$ alkyne, and m and n may each be 1, 2 or 3.

The resin may include an epoxy compound represented by the following Formula 2.

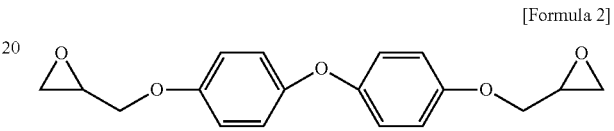

[Formula 2]

The epoxy compound of Formula 2, the curing agent, and the inorganic filler may be included at contents of 3 to 40% by weight, 0.5 to 30% by weight, and 40 to 96.5% by weight, respectively, based on the total weight of the resin composition.

The inorganic filler may include a first alumina group having a particle size of 0.1 μm or more and less than 10 μm, a second alumina group having a particle size of 10 μm or more and less than 30 μm, and a third alumina group having a particle size of 30 μm or more and 60 μm or less.

The first alumina group may be included at a content of 10 to 66.5% by weight, based on the total weight of the resin composition, the second alumina group may be included at a content of 10 to 66.5% by weight, based on the total weight of the resin composition, and the third alumina group may be included at a content of 20 to 76.5% by weight, based on the total weight of the resin composition.

A content ratio of the first alumina group and the second alumina group may be in a range of 1:1 to 2, and a content ratio of the first alumina group and the third alumina group may be in a range of 1:1.5 to 5.5.

According to an aspect of the present invention, there is provided a printed circuit board which includes a metal plate, an insulating layer formed on the metal plate, and a circuit pattern formed on the insulating layer, wherein the insulating layer is made of the resin composition according to one exemplary embodiment of the present invention.

Advantageous Effects

According to exemplary embodiments of the present invention, a resin composition can be obtained. When the resin composition is used, a heat dissipation layer having high thermal conductivity can be obtained, and reliability and heat dissipation performance of electronic devices mounted on electronic parts can be improved.

DESCRIPTION OF DRAWINGS

FIG. 1 is a cross-sectional view of a printed circuit board according to one exemplary embodiment of the present invention.

BEST MODE

The present invention may be modified in various forms and have various embodiments, and thus particular embodiments thereof will be illustrated in the accompanying drawings and described in the detailed description. However, it should be understood that the description set forth herein is not intended to limit the present invention, and encompasses all modifications, equivalents, and substitutions that do not depart from the spirit and scope of the present invention.

Although the terms encompassing ordinal numbers such as first, second, etc. may be used to describe various elements, these elements are not limited by these terms. These terms are only used for the purpose of distinguishing one element from another. For example, a first element could be termed a second element, and, similarly, a second element could be termed a first element without departing from the scope of the present invention. The term "and/or" includes any and all combinations of a plurality of associated listed items.

The terminology provided herein is merely used for the purpose of describing particular embodiments, and is not intended to be limiting of exemplary embodiments of the present invention. The singular forms "a," "an" and "the" are intended to include the plural forms as well, unless the context clearly indicates otherwise. It should be understood that the terms "comprises," "comprising," "includes" and/or "including," when used herein, specify the presence of stated features, integers, steps, operations, elements, components and/or combinations thereof, but do not preclude the presence or addition of one or more other features, integers, steps, operations, elements, components and/or combinations thereof.

Unless defined otherwise, all the terms (including technical and scientific terms) used herein have the same meaning as commonly understood by one of ordinary skill in the art to which the present invention belongs. It will be further understood that the terms, such as those defined in commonly used dictionaries, should be interpreted as having meanings that are consistent with their meanings in the context of the relevant art, and will not be interpreted in an idealized or overly formal sense unless expressly defined otherwise herein.

It will be understood that when it is assumed that a part such as a layer, film, region, or board is disposed "on" another part, it can be directly disposed on the other part or intervening parts may also be present therebetween. On the other hand, it will be understood that when it is assumed that a part such as a layer, film, region, or board is "directly disposed on" another part, no intervening parts may be present therebetween.

Hereinafter, exemplary embodiments of the present invention will be described in detail with reference to the accompanying drawings. Regardless of reference numerals, like numbers refer to like elements throughout the description of the figures, and the description of the same elements will be not reiterated.

In this specification, the term "% by weight(s)" may be replaced with "part(s) by weight."

According to an aspect of the present invention, there is provided a resin composition which includes a resin, a curing agent, and an inorganic filler, wherein the inorganic filler includes at least two alumina ($Al_2O_3$) groups classified according to a particle size.

The resin composition one exemplary embodiment of the present invention may include a resin at a content of 3% by weight to 40% by weight, preferably 3% by weight to 30% by weight, and more preferably 3% by weight to 20% by weight, based on the total weight of the resin composition. When the resin is included at a content of 3% by weight or less based on the total weight of the resin composition, an adhesive property may be degraded. When the resin is included at a content of 40% by weight or more based on the total weight of the resin composition, it may be difficult to adjust the thickness. In this case, the resin composition may include a crystalline epoxy resin at a content of 3% by weight or more, based on the total weight of the resin composition. When the crystalline epoxy resin is included at a content of less than 3% by weight based on the total weight of the resin composition, the resin composition may not be crystallized, and thus a thermal conduction effect may be reduced.

Here, the crystalline epoxy resin may be a mesogenic compound represented by the following Formula 1. Mesogen is a fundamental unit of a liquid crystal, and includes a rigid structure. For example, the mesogen may include a rigid structure like biphenyl, phenyl benzoate, naphthalene, etc.

[Formula 1]

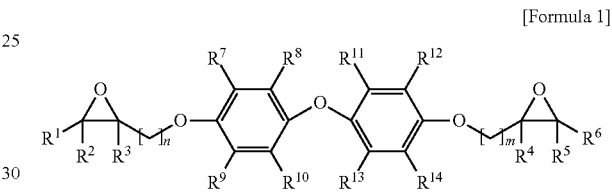

In Formula 1, $R^1$ to $R^{14}$ may each independently be selected from the group consisting of H, Cl, Br, F, a $C_1$-$C_3$ alkyl, a $C_2$-$C_3$ alkene, and a $C_2$-$C_3$ alkyne, and m and n may each be 1, 2 or 3.

The crystalline epoxy resin may be represented by the following Formula 2.

[Formula 2]

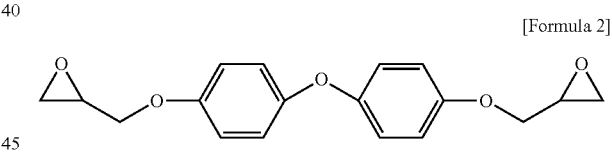

The epoxy equivalent weight of the epoxy compound (hereinafter referred to as 4,4'-biphenolether diglycidyl ether) of Formula 2 may be in a range of 120 to 300, preferably 150 to 200. For the physical properties of the epoxy compound of Formula 2, the epoxy compound had a melting point of 158° C., and the $^1$H NMR ($CDCL_3$-d6, ppm) results are as below: δ=8.58 (s, 2H), δ=8.17-8.19 (d, 4H), δ=7.99-8.01 (d, 4H), δ=7.33 (s, 4H), δ=4.69-4.72 (d, 1H), δ=4.18-4.22 (m, 1H), δ=3.36-3.40 (m, 1H), δ=2.92-2.94 (m, 1H) and δ=2.74-2.77 (m, 1H). The melting point was measured at a heating rate of 10° C./min using a differential scanning calorimetry device (DSC Q100 commercially available from TA Instruments Ltd.). The NMR measurement was performed using H-NMR after the epoxy compound is dissolved in $CDCL_3$-d6.

The epoxy compound of Formula 2 is crystalline at room temperature. The expression of crystallinity may be confirmed using the endothermic peaks of crystals in differential scanning calorimetric analysis. In this case, the endothermic peak may be shown as a plurality of peaks or broad peaks, the lowest temperature of the endothermic peak may be greater than or equal to 60° C., preferably 70° C., and the highest temperature of the endothermic peak may be less than or equal to 120° C., preferably 100° C.

Meanwhile, the resin composition may further include another typical amorphous epoxy resin containing two or more epoxy groups in the molecule in addition to the crystalline epoxy compound of Formula 1 or 2. When the resin composition further includes the amorphous epoxy resin in addition to the crystalline epoxy resin, room-temperature stability may be improved.

For example, the amorphous epoxy resin may include at least one selected from the group consisting of bisphenol A, bisphenol F, 3,3',5,5'-tetramethyl-4,4'-dihydroxydiphenyl methane, 4,4'-dihydroxydiphenyl sulfone, 4,4'-dihydroxydiphenyl sulfide, 4,4'-dihydroxydiphenyl ketone, fluorene bisphenol, 4,4'-biphenol-3,3',5,5'-tetramethyl-4,4'-dihydroxybiphenyl, 2,2'-biphenol, resorcinol, catechol, t-butylcatechol, hydroquinone, t-butylhydroquinone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated or polyallylated compound of the dihydroxynaphthalene, a divalent phenol such as allylated bisphenol A, allylated bisphenol F, or allylated phenol novolac, or a trivalent or more phenol such as phenol novolac, bisphenol A novolac, o-cresol novolac, m-cresol novolac, p-cresol novolac, xylenol novolac, poly-p-hydroxystyrene, tris-(4-hydroxyphenyl)methane, 1,1,2,2-tetrakis(4-hydroxyphenyl)ethane, phloroglucinol, pyrogallol, t-butylpyrogallol, allylated pyrogallol, polyallylated pyrogallol, 1,2,4-benzenetriol, 2,3,4-trihydroxybenzophenone, phenol aralkyl resin, naphthol aralkyl resin, or dicyclopentadiene-based resin, a glycidyl-esterified compound derived from a halogenated bisphenol such tetrabromobisphenol A, and a mixture thereof.

The resin composition according to one exemplary embodiment of the present invention may include at least one resin selected from the group consisting of triethylenediamine, diphenylphosphine, tetraphenylborate, and a mixture thereof.

The resin composition according to one exemplary embodiment of the present invention may include the curing agent at a content of 0.5% by weight to 30% by weight, based on the total weight of the resin composition. When the curing agent is included at a content of 0.5% by weight or less based on the total weight of the resin composition, an adhesive property may be degraded. On the other hand, when the curing agent is included at a content of 30% by weight or more based on the total weight of the resin composition, it may be difficult to adjust the thickness. The curing agent included in the resin composition may be 4,4'-diaminodiphenyl sulfone represented by the following Formula 3. The curing agent of Formula 3 may react with the epoxy resin of Formula 2 to improve thermal stability of the epoxy resin composition.

[Formula 3]

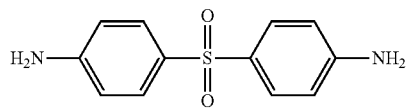

In addition to the 4,4'-diaminodiphenyl sulfone, the resin composition may further include at least one selected from the group consisting of a phenolic curing agent, an amine-based curing agent, and an acid anhydride-based curing agent.

For example, the phenolic curing agent may include at least one selected from the group consisting of bisphenol A, bisphenol F, 4,4'-dihydroxydiphenyl methane, 4,4'-dihydroxydiphenyl ether, 1,4-bis(4-hydroxyphenoxy)benzene, 1,3-bis(4-hydroxyphenoxy)benzene, 4,4'-dihydroxydiphenyl sulfide, 4,4'-dihydroxydiphenyl ketone, 4,4'-dihydroxydiphenyl sulfone, 4,4'-dihydroxybiphenyl, 2,2'-dihydroxybiphenyl, 10-(2,5-dihydroxyphenyl)-10 OH-9-oxa-10-phosphaphenanthrene-10-oxide, phenol novolac, bisphenol A novolac, o-cresol novolac, m-cresol novolac, p-cresol novolac, xylenol novolac, poly-p-hydroxystyrene, hydroquinone, resorcinol, catechol, t-butylcatechol, t-butylhydroquinone, phloroglucinol, pyrogallol, t-butylpyrogallol, allylated pyrogallol, polyallylated pyrogallol, 1,2,4-benzenetriol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, an allylated or polyallylated compound of the dihydroxynaphthalene, allylated bisphenol A, allylated bisphenol F, allylated phenol novolac, allylated pyrogallol, and a mixture thereof.

For example, the amine-based curing agent may include an aliphatic amine, a polyether polyamine, an alicyclic amine, an aromatic amine, etc. The aliphatic amine may include at least one selected from the group consisting of ethylenediamine, 1,3-diaminopropane, 1,4-diaminopropane, hexamethylenediamine, 2,5-dimethylhexamethylenediamine, trimethylhexamethylenediamine, diethylenetriamine, iminobis propylamine, bis(hexamethylene)triamine, triethylenetetramine, tetraethylenepentamine, pentaethylenehexamine, N-hydroxyethyl ethylenediamine, tetra(hydroxyethyl)ethylenediamine, etc. The polyether polyamine may include at least one selected from the group consisting of triethylene glycol diamine, tetraethylene glycol diamine, diethylene glycol bis(propylamine), polyoxypropylene diamine, a polyoxypropylene triamine, and a mixture thereof. The alicyclic amine may include at least one selected from the group consisting of isophorone diamine, methacene diamine, N-aminoethylpiperazine, bis(4-amino-3-methyldicyclohexyl)methane, bis(aminomethyl)cyclohexane, 3,9-bis(3-aminopropyl)-2,4,8,10-tetraoxaspiro(5,5)undecane, norbornene diamine, etc. The aromatic amine may include at least one selected from the group consisting of tetrachloro-p-xylenediamine, m-xylenediamine, p-xylenediamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenylsulfone, m-aminophenol, m-aminobenzylamine, benzyldimethylamine, 2-dimethylaminomethyl)phenol, triethanolamine, methylbenzylamine, α-(m-aminophenyl)ethylamine, α-(p-aminophenyl)ethylamine, diaminodiethyldimethyldiphenylmethane, α,α'-bis(4-aminophenyl)-p-diisopropylbenzene, and a mixture.

For example, the acid anhydride-based curing agent may include at least one selected from the group consisting of a dodecenyl succinic anhydride, a polyadipic anhydride, a polyazelaic anhydride, a polysebacic anhydride, a poly(ethyl octadecanoic diacid) anhydride, a poly(phenyl hexadecane diacid) anhydride, a methyltetrahydrophthalic anhydride, a methylhexahydrophthalic anhydride, a hexahydrophthalic anhydride, a methyl himic anhydride, a tetrahydrophthalic anhydride, a trialkyl tetrahydrophthalic anhydride, a methylcyclohexene dicarboxylic anhydride, a methylcyclohexene tetracarboxylic anhydride, a phthalic anhydride, a trimellitic anhydride, a pyromellitic anhydride, a benzophenone tetracarboxylic anhydride, ethylene glycol bistrimellitate, a chlorendic anhydride, a nadic anhydride, a methyl nadic anhydride, a 5-(2,5-dioxotetrahydro-3-furanyl)-3-methyl-3-cyclohexane-1,2-dicarboxylic anhydride, a 3,4-dicarboxy-1,2,3,4-tetrahydro-1-naphthalene succinic dianhydride, a 1-methyl-dicarboxy-1,2,3,4-tetrahydro-1-naphthalene succinic dianhydride, and a mixture thereof.

The resin composition according to one exemplary embodiment of the present invention may include at least one curing agent selected from the group consisting of ethylenediamine, 1,3-diaminopropane, methanediamine, m-phenylenediamine, triethanolamine, and a mixture thereof.

The resin composition may further include a curing accelerator.

The resin composition according to one exemplary embodiment of the present invention may include the inorganic filler at a content of 40% by weight to 96.5% by weight, based on the total weight of the resin composition. When the inorganic filler is includes at a content of less than 40% by weight, high thermal conductivity, low thermal expansibility, and high-temperature thermal resistance of the resin composition may not be ensured. The high thermal conductivity, low thermal expansibility and high-temperature thermal resistance are improved as the inorganic filler is added at an increasing amount. The high thermal conductivity, low thermal expansibility and high-temperature thermal resistance are not improved according to the volume fraction of the inorganic filler, but start to be dramatically improved when the inorganic filler is added at a certain amount. However, when the inorganic filler is included at a content of greater than 96.5% by weight, formability is deteriorated due to an increase in viscosity.

The inorganic filler includes alumina ($Al_2O_3$). In this case, the alumina used as the inorganic filler may include at least two groups classified according to a particle size. For example, the inorganic filler may include an alumina group having a particle diameter of 0.1 μm or more and less than 10 μm, preferably 0.5 μm to 5 μm, an alumina group having a particle diameter of 10 μm or more and less than 30 μm, preferably 15 μm to 25 μm, and an alumina group having a particle diameter of 30 μm or more and 60.0 μm or less, preferably 30.0 μm to 45.0 μm.

The alumina group having a particle diameter of 0.1 μm or more and less than 10 μm may be included at a content of 10% by weight to 66.5% by weight, based on the total weight of the resin composition. The alumina group having a particle diameter of 10 μm or more and less than 30 μm may be included at a content of 10% by weight to 66.5% by weight, based on the total weight of the resin composition. The alumina group having a particle diameter of 30 μm or more and 60.0 μm or less may be included at a content of 20% by weight to 76.5% by weight, preferably 30% by weight to 70% by weight, and more preferably 40% by weight to 65% by weight, based on the total weight of the resin composition.

A content ratio, that is, a weight ratio, of the alumina group having a particle diameter of 0.1 μm or more and less than 10 μm and the alumina group having a particle diameter of 10 μm or more and less than 30 μm may be in a range of 1:1 to 2, and a content ratio of the alumina group having a particle diameter of 0.1 μm or more and less than 10 μm and the alumina group having a particle diameter of 30 μm or more and 60.0 μm or less may be in a range of 1:1.5 to 5.5. When the alumina groups are included within this content ratio range, the volume ratio may be improved using the alumina having a higher particle size (for example, an alumina group having a particle diameter of 30.0 μm to 60.0 μm), and a contact path for heat transfer may be maximized by uniformly filling voids with alumina having a small or medium particle size (for example, an alumina group having a particle diameter of 0.1 μm or more and less than 10 μm, and an alumina group having a particle diameter of 10 μm or more and less than 30 μm) to reduce the voids. Therefore, thermal conductivity may be improved.

Also, when the alumina having a higher particle size (for example, an alumina group having a particle diameter of 30.0 μm to 60.0 μm) is included at a higher content than the alumina having a small or medium particle size (for example, an alumina group having a particle diameter of 0.1 μm or more and less than 10 μm, and an alumina group having a particle diameter of 10 μm or more and less than 30 μm), the thermal conductivity may be further improved.

Meanwhile, the resin composition according to one exemplary embodiment of the present invention may include an additive at a content of 0.1% by weight to 2% by weight, preferably 0.5% by weight to 1.5% by weight, based on the total weight of the resin composition. For example, the additive may be phenoxy, or a hyperbranched polyester. When the additive is added at a content of less than 0.1% by weight, it is difficult to realize desired properties (for example, adhesivity). On the other hand, when the additive is added at a content of greater than 2% by weight, formability is deteriorated due to an increase in viscosity.

A prepreg may be prepared by coating or impregnating a fiber base or a glass base with the resin composition according to one exemplary embodiment of the present invention and semi-curing the resin composition by heating.

The resin composition according to one exemplary embodiment of the present invention may be applied to printed circuit boards. FIG. 1 is a cross-sectional view of a printed circuit board according to one exemplary embodiment of the present invention.

Referring to FIG. 1, the printed circuit board 100 includes a metal plate 110, an insulating layer 120, and a circuit pattern 130.

The metal plate 110 may be made of at least one selected from the group consisting of copper, aluminum, nickel, gold, platinum, and an alloy thereof.

The insulating layer 120 made of the resin composition according to one exemplary embodiment of the present invention is formed on the metal plate 110.

The circuit pattern 130 is formed on the insulating layer 120.

When the resin composition according to one exemplary embodiment of the present invention is used for the insulating layer, the printed circuit board having excellent heat dissipation performance may be obtained.

Hereinafter, the present invention will be described in further detail in conjunction with Examples and Comparative Examples.

EXAMPLE 1

A solution formulated from 11% by weight of the crystalline epoxy compound of Formula 2, 8% by weight of 4,4'-diaminodiphenyl sulfone, 11% by weight of a hyperbranched polyester, 25% by weight of alumina having a particle size of 33 μm, 30% by weight of alumina having a particle size of 24 μm, and 15% by weight of alumina having a particle size of 0.5 μm to 5 μm was prepared, and then stirred at room temperature for 5 minutes to obtain a resin composition of Example 1.

EXAMPLE 2

A solution formulated from 11% by weight of the crystalline epoxy compound of Formula 2, 8% by weight of 4,4'-diaminodiphenyl sulfone, 11% by weight of a hyperbranched polyester, 20% by weight of alumina having a particle size of 33 μm, 30% by weight of alumina having a particle size of 24 μm, and 20% by weight of alumina having a particle size of 0.5 μm to 5 μm was prepared, and then stirred at room temperature for 5 minutes to obtain a resin composition of Example 2.

EXAMPLE 3

A solution formulated from 11% by weight of the crystalline epoxy compound of Formula 2, 8% by weight of 4,4'-diaminodiphenyl sulfone, 11% by weight of a hyperbranched polyester, 30% by weight of alumina having a particle size of 33 μm, 20% by weight of alumina having a particle size of 24 μm, and 20% by weight of alumina having a particle size of 0.5 μm to 5 μm was prepared, and then stirred at room temperature for 5 minutes to obtain a resin composition of Example 3.

EXAMPLE 4

A solution formulated from 11% by weight of the crystalline epoxy compound of Formula 2, 8% by weight of 4,4'-diaminodiphenyl sulfone, 11% by weight of a hyperbranched polyester, 35% by weight of alumina having a particle size of 33 μm, 21% by weight of alumina having a particle size of 24 μm, and 14% by weight of alumina having a particle size of 0.5 μm to 5 μm was prepared, and then stirred at room temperature for 5 minutes to obtain a resin composition of Example 4.

EXAMPLE 5

A solution formulated from 11% by weight of the crystalline epoxy compound of Formula 2, 8% by weight of 4,4'-diaminodiphenyl sulfone, 6% by weight of a hyperbranched polyester, 50% by weight of alumina having a particle size of 33 μm, 15% by weight of alumina having a particle size of 24 μm, and 10% by weight of alumina having a particle size of 0.5 μm to 5 μm was prepared, and then stirred at room temperature for 5 minutes to obtain a resin composition of Example 5.

COMPARATIVE EXAMPLE 1

A solution formulated from 11% by weight of the crystalline epoxy compound of Formula 2, 8% by weight of 4,4'-diaminodiphenyl sulfone, 1% by weight of a hyperbranched polyester, 10% by weight of alumina having a particle size of 33 μm, 10% by weight of alumina having a particle size of 24 μm, and 60% by weight of alumina having a particle size of 0.5 μm to 5 μm was prepared, and then stirred at room temperature for 5 minutes to obtain a resin composition of Comparative Example 1.

COMPARATIVE EXAMPLE 2

A solution formulated from 11% by weight of the crystalline epoxy compound of Formula 2, 8% by weight of 4,4'-diaminodiphenyl sulfone, 16% by weight of a hyperbranched polyester, 5% by weight of alumina having a particle size of 33 μm, 10% by weight of alumina having a particle size of 24 μm, and 50% by weight of alumina having a particle size of 0.5 μm to 5 μm was prepared, and then stirred at room temperature for 5 minutes to obtain a resin composition of Comparative Example 2.

COMPARATIVE EXAMPLE 3

A solution formulated from 11% by weight of the crystalline epoxy compound of Formula 2, 8% by weight of 4,4'-diaminodiphenyl sulfone, 3% by weight of a hyperbranched polyester, 60% by weight of alumina having a particle size of 24 μm, and 18% by weight of alumina having a particle size of 0.5 μm to 5 μm was prepared, and then stirred at room temperature for 5 minutes to obtain a resin composition of Comparative Example 3.

Thermal conductivity of the epoxy resin compositions of Example 1 to 5 and Comparative Example 1 to 3 was measured by means of a transient hot-wire method using a thermal conductivity meter (LFA447 commercially available from Netzsch-Gerätebau GmbH.). The measured results are listed in Table 1.

TABLE 1

| Experiment No. | Thermal conductivity (W/m · K) |
| --- | --- |
| Example 1 | 8.0 |
| Example 2 | 7.8 |
| Example 3 | 8.3 |
| Example 4 | 8.9 |
| Example 5 | 9.8 |
| Comparative Example 1 | 3 |
| Comparative Example 2 | 4 |
| Comparative Example 3 | 6 |

As listed in Table 1, it could be seen that the resin compositions of Examples 1 to 5, which included alumina having a particle size of 33 μm at 20% by weight or more, alumina having a particle size of 24 μm at 10% by weight or more, and alumina having a particle size of 0.5 μm to 5 μm at 10% by weight or more in addition to the crystalline epoxy compound of Formula 2 and 4,4'-diaminodiphenyl sulfone, had higher thermal conductivity than the resin compositions of Comparative Examples 1 to 3 which included alumina having a particle size of 24 μm at 10% by weight or more, and alumina having a particle size of 0.5 μm to 5 μm at 10% by weight or more, but included alumina having a particle size of 33 μm at less than 20% by weight.

In particular, it could be seen that, when the content ratio of the alumina having a particle size of 0.5 μm to 5 μm and the alumina having a particle size of 24 μm was 1:1 and the content ratio of the alumina having a particle size of 0.5 μm to 5 μm and the alumina having a particle size of 33 μm was 1:1.5 as in Example 3, the content ratio of the alumina having a particle size of 0.5 μm to 5 μm and the alumina having a particle size of 24 μm was 1:1.5 and the content ratio of the alumina having a particle size of 0.5 μm to 5 μm and the alumina having a particle size of 33 μm was 1:2.5 as in Example 4, and the content ratio of the alumina having a particle size of 0.5 μm to 5 μm and the alumina having a particle size of 24 μm was 1:1.5 and the content ratio of the alumina having a particle size of 0.5 μm to 5 μm and the alumina having a particle size of 33 μm was 1:5 as in Example 5, the resin compositions especially higher thermal conductivity than the resin compositions in which the content ratio of the alumina having a particle size of 0.5 μm to 5 μm and the alumina having a particle size of 24 μm fell out of 1:1 to 2, or the content ratio of the alumina having a particle size of 0.5 μm to 5 μm and the alumina having a particle size of 33 μm fell out of 1:1.5 to 5.5 as in Example 1 or 2.

Although the preferred embodiments of the present invention have been shown and described in detail, it would be appreciated by those skilled in the art that modifications and changes may be made in these embodiments without departing from the scope of the invention, the scope of which is defined in the claims and their equivalents.

The invention claimed is:

1. A resin composition comprising:
a resin comprising an epoxy compound represented by the following Formula 1;
a curing agent comprising diaminodiphenylsulfone; and
an inorganic filler:

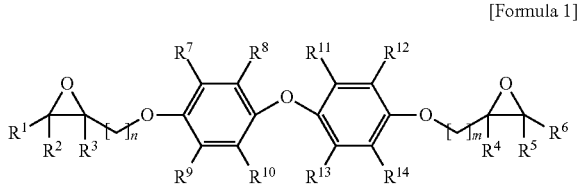

[Formula 1]

wherein each of $R^1$ to $R^{14}$ is independently selected from the group consisting of H, Cl, Br, F, a $C_1$-$C_3$ alkyl, a $C_2$-$C_3$ alkene, and a $C_2$-$C_3$ alkyne, and each of m and n is 1, 2 or 3, wherein the inorganic filler includes at least three alumina ($Al_2O_3$) groups classified according to a particle size, a first alumina group having a particle size of 0.1 μm or more and less than 10 μm a second alumina group having a article size of 10 μm or more and less than 30 μm, and a third alumina group having a particle size of 30 μm or more and 60 μm or less, and wherein a content ratio of the first alumina group and the second alumina group is in a range of 1:1 to 2, and a content ratio of the first alumina group and the third alumina group is in a range of 1:1.5 to 5.5.

2. The resin composition of claim 1, wherein the resin comprises an epoxy compound represented by the following Formula 2:

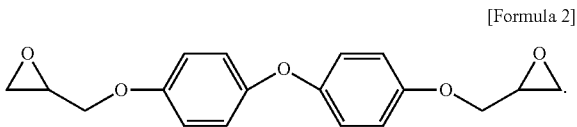 [SMILES: c1cc(Oc2ccc(OCC3CO3)cc2)ccc1OCC1CO1]

[Formula 2]

3. The resin composition of claim 1, wherein each of m and n is 2 or 3.

4. The resin composition of claim 3, wherein each of m and n is 3.

5. The resin composition of claim 1, wherein the first alumina group is included at a content of 10 to 66.5% by weight, based on the total weight of the resin composition, the second alumina group is included at a content of 10 to 66.5% by weight, based on the total weight of the resin composition, and the third alumina group is included at a content of 20 to 76.5% by weight, based on the total weight of the resin composition.

6. The resin composition of claim 5, wherein the third alumina group is included at a content of 30 to 70% by weight, based on the total weight of the resin composition.

7. The resin composition of claim 6, wherein the third alumina group is included at a content of 40 to 65% by weight, based on the total weight of the resin composition.

8. The resin composition of claim 1, wherein the particle size of the first alumina group is 0.5 μm to 5 μm, the particle size of the second alumina group is 15 μm to 25 μm, and the particle size of the third alumina group is 30 μm to 45 μm.

9. The resin composition of claim 1, wherein the epoxy compound of Formula 1, the curing agent, and the inorganic filler are included at contents of 3 to 40% by weight, 0.5 to 30% by weight, and 40 to 96.5% by weight, respectively, based on the total weight of the resin composition.

10. The resin composition of claim 1, further comprising at least one of phenoxy and hyperbranched polyester.

11. A printed circuit board comprising:
a metal plate,
an insulating layer formed on the metal plate; and
a circuit pattern formed on the insulating layer,
wherein the insulating layer is made of the resin composition defined in claim 1.

12. The printed circuit board of claim 11, wherein each of m and n is 2 or 3.

13. The printed circuit board of claim 12, wherein each of m and n is 3.

* * * * *